United States Patent [19]

Huang

[11] Patent Number: 5,872,480

[45] Date of Patent: Feb. 16, 1999

[54] PROGRAMMABLE DOWN-SAMPLER HAVING PLURAL DECIMATORS AND MODULATOR USING SAME

[75] Inventor: Ke-Chiang Huang, Hsinchu, Taiwan

[73] Assignee: Industrial Technology Research Institute, Hsinchu, Taiwan

[21] Appl. No.: 935,561

[22] Filed: Sep. 23, 1997

[51] Int. Cl.$^6$ .............................. H03M 7/00; H04L 27/22
[52] U.S. Cl. .................. 329/304; 341/61; 364/724.1; 375/324; 375/329
[58] Field of Search ..................................... 329/304, 310; 375/324, 329, 340, 343; 341/61; 364/724.1

[56] References Cited

U.S. PATENT DOCUMENTS

| | | | |
|---|---|---|---|
| 4,020,332 | 4/1977 | Crochiere et al. | 341/61 |
| 5,325,318 | 6/1994 | Harris et al. | 364/724.1 |
| 5,425,057 | 6/1995 | Paff | 375/326 |
| 5,504,455 | 4/1996 | Inkol | 329/304 |
| 5,515,402 | 5/1996 | Chester | 375/350 |
| 5,524,126 | 6/1996 | Clewer et al. | 375/355 |
| 5,621,675 | 4/1997 | Linz et al. | 364/724.1 |

OTHER PUBLICATIONS

Vaidyanathan, P.P. "Fundamentals of Multirate Systems," in *Multirate Systems and Filter Banks*. Prentice Hall, Englewood Cliffs, N.J., 1993, pp. 100–113, 120–125, 130–131, 138–143 and 150–155.

*CAS 1643 Dual Digital Low Pass Filter Preliminary Information.* Comatlas, Chateaubourg, Jan. 1997, pp. 1, 3–4 and 13.

*Primary Examiner*—Siegfried H. Grimm
*Attorney, Agent, or Firm*—Christensen O'Connor Johnson & Kindness PLLC

[57] ABSTRACT

A digital QPSK demodulator includes a plurality of two-input-two-output (TITO) two-fold decimators where each TITO two-fold decimator operates at a rate equal to its input data rate. The in-phase I signal and the quadrature Q signal are computed in an interleaved sequence of {Q"(n), I"(n), Q"(n+1), I"(n+1), ... } to generate Q" decimation output and I" decimation output. The TITO two-fold decimators are cascaded in a reverse order to form a programmable down-sampler which decimates the input data by factors of 1, 2, 4, 8 or more. In a first embodiment, the programmable down-sampler is coupled between a complex multiplier and an interpolator. In a second embodiment, the in-phase and quadrature signals are fed through a complex multiplier, an interpolator, then the programmable down-sampler. In the third embodiment, the in-phase and quadrature signals are fed through an interpolator, a complex multiplier, then the programmable down-sampler.

25 Claims, 14 Drawing Sheets

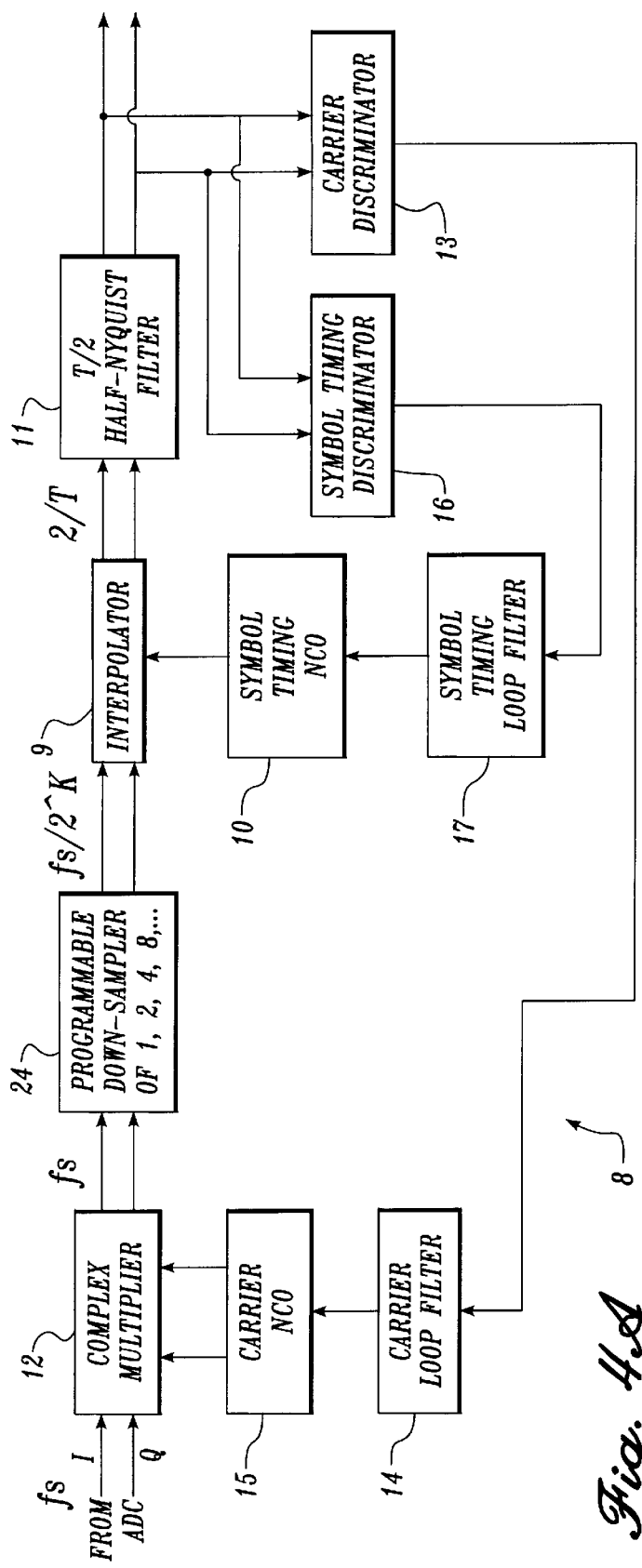
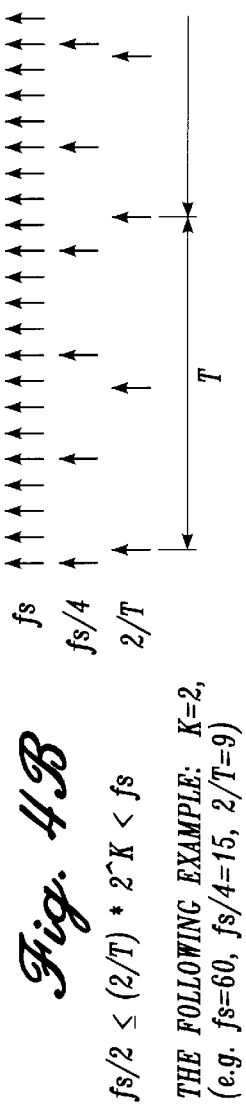
Fig. 4A
Fig. 4B
$fs/2 \leq (2/T) * 2^{\wedge}K < fs$
THE FOLLOWING EXAMPLE: $K=2$, (e.g. $fs=60$, $fs/4=15$, $2/T=9$)

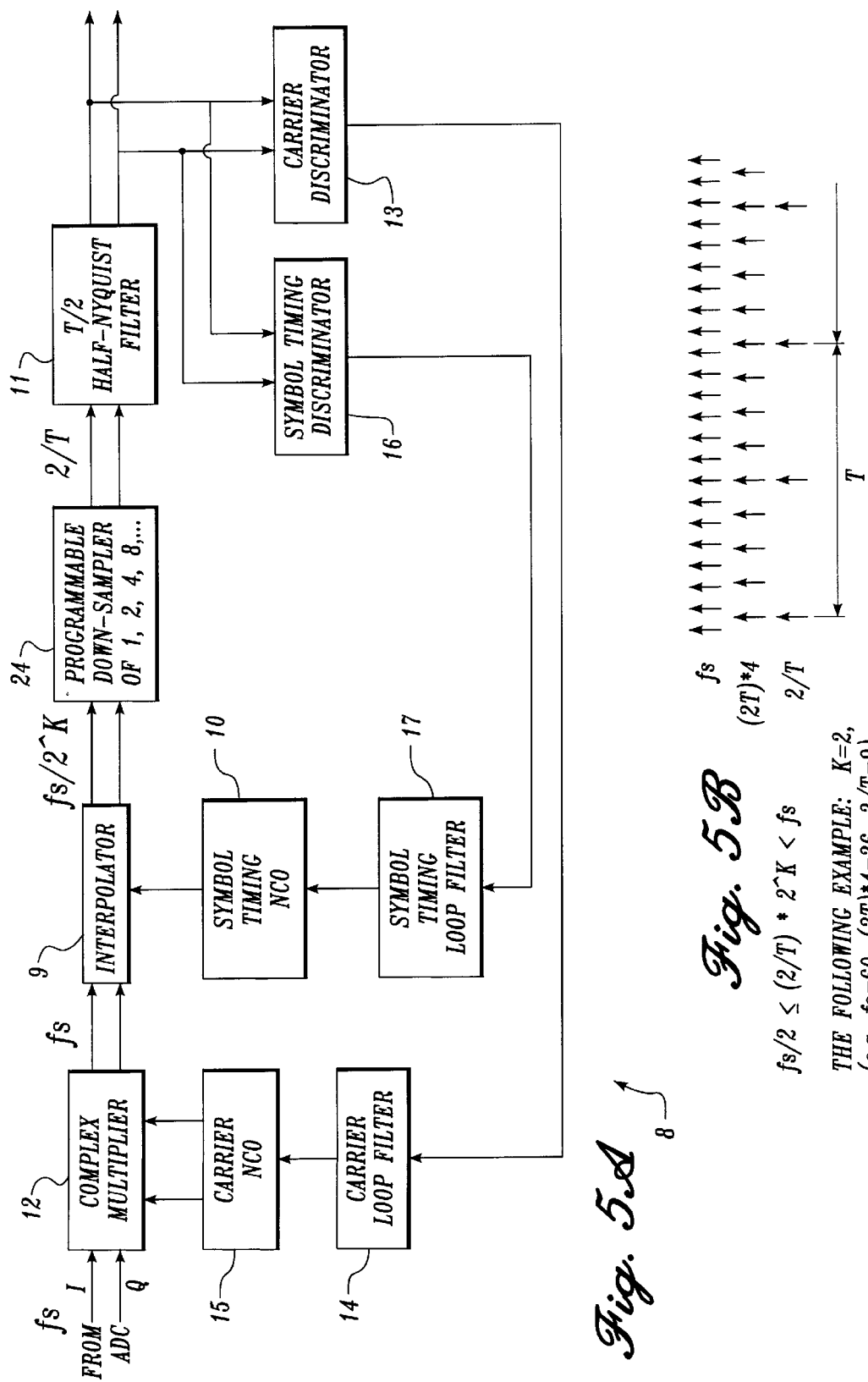

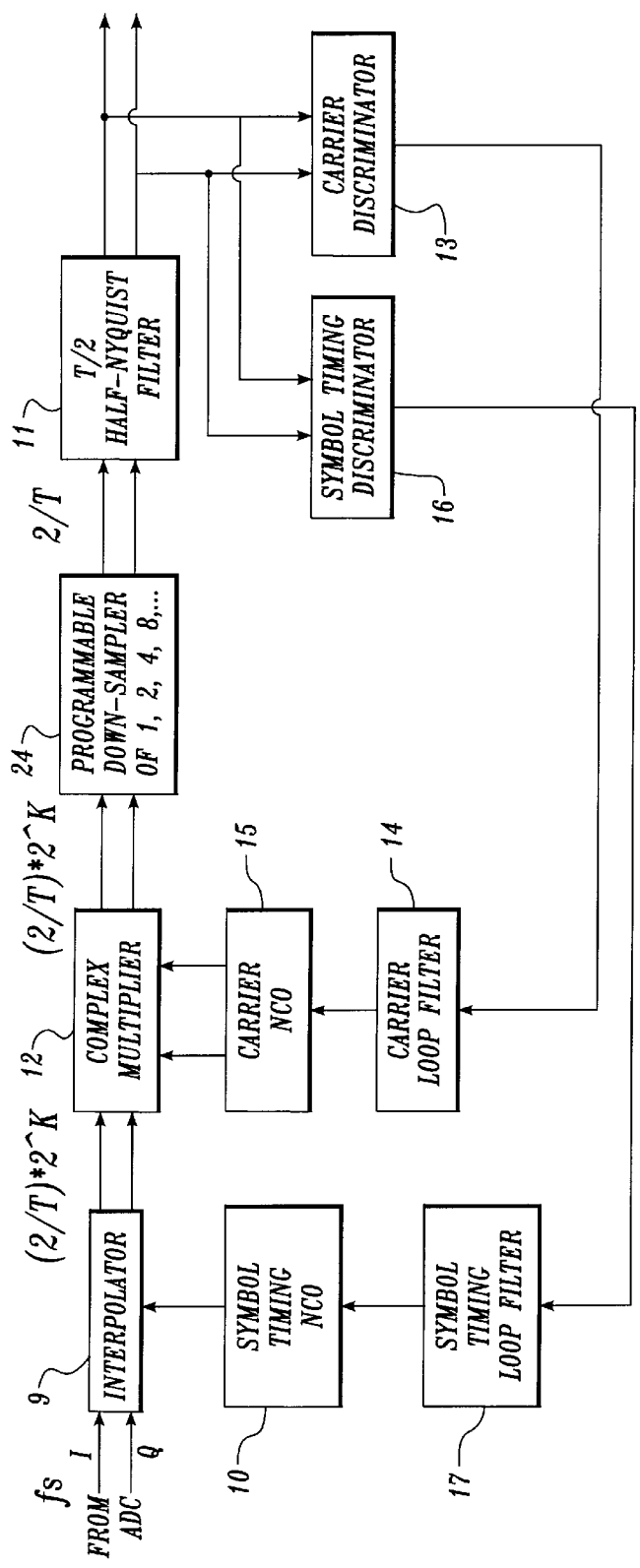
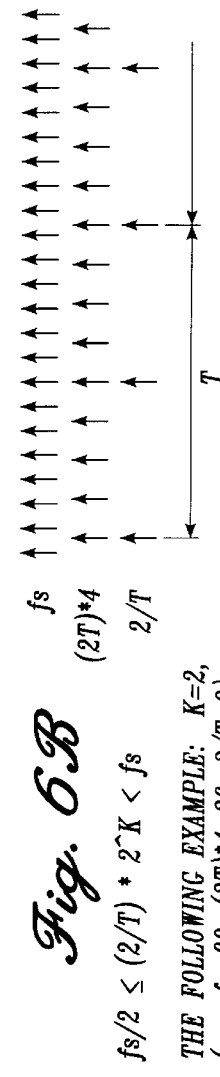

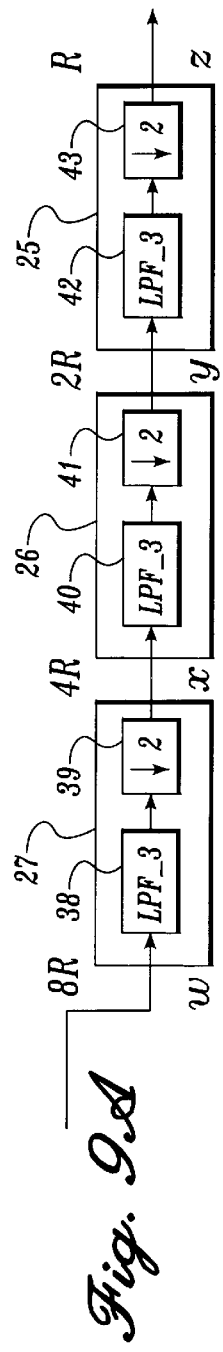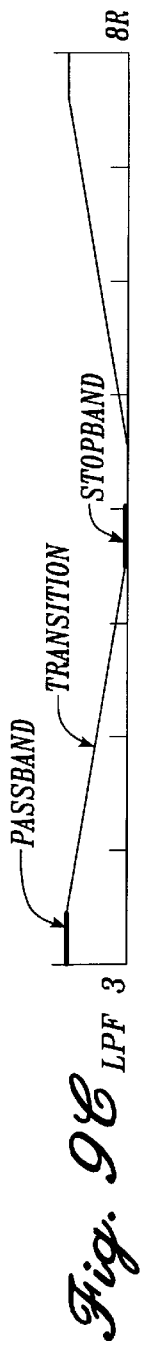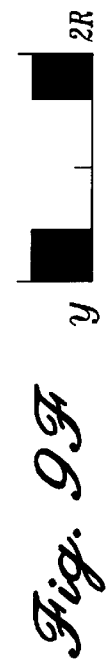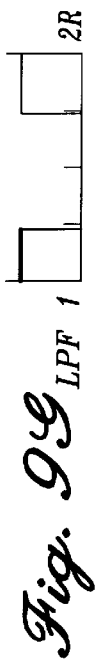

A TIME DELAY REGISTER OF DELAY $Z^{-1}$ WHERE $Z^{-1} = 1/R$

PROGRAMMABLE DOWN-SAMPLER HAVING PLURAL DECIMATORS AND MODULATOR USING SAME

FIELD OF THE INVENTION

The present invention relates generally to digital signal processing and, more particularly, to a demodulator that re-samples quadrature and in-phase signals with a programmable down-sampler.

BACKGROUND OF THE INVENTION

Digital demodulators in modern technology require operating at higher reduced sampling rates across a wide range of bandwidths in a satellite QPSK receiver. In multi channel per carrier (MCPC), multiple channels of programs are muxed in one QPSK signal spectrum across a bandwidth of a satellite transponder at a high symbol rate. In single channel per carrier (SCPC), each QPSK spectrum has just one channel of program where individual carriers are spread across a bandwidth of a satellite transponder that sample data at a low symbol rate. The process of converting a signal from a given rate to a reduction in sampling rate is know as decimation or down sampling.

In FIG. 1, there is shown a satellite QPSK receiver with a digital QPSK demodulator having an antenna I detecting a radio frequency (RF) signal, typically in the Ku band. A tuner 2 receives the RF signal and transmits an intermediate frequency that has been translated, for example, to 479.5 MHz, to scalars 3 and 4. A local oscillator 5 is coupled to the scalars 3 and 4 for sending the signals to a dual analog-to-digital (ADC) converter 6. The dual ADC converter 6 is driven by a fixed frequency crystal oscillator 7 with a fs sampling rate, typically at a frequency of greater than 60 MHz. The dual ADC converter 6 transmits a quadrature ("Q") signal and an in-phase ("I") signal to the digital QPSK demodulator 8.

FIG. 2 is a block diagram of a conventional digital QPSK demodulator 8 receiving the I and Q signals from the ADC converter 6. A typical interpolator 9 has two input arms, I and Q, of finite impulse response (FIR) filters (not shown) sharing the same time-varying filter coefficients generated from a look-up table. The FIR interpolation filters include shift registers for storing the asynchronous input data. A symbol timing NCO 10 provides the synchronous timing phase so that the FIR interpolation filters can access a coefficient look-up table to obtain a set of filter coefficients. The interpolator 9 re-samples the asynchronous input data based on the filter coefficients and performs mathematical computations to produce synchronized output signals.

A half-Nyquist filter 11 also contains two input arms, I and Q, coupled to a complex multiplier 12. The half-Nyquist filter 11 typically performs the computation of a "square root raised cosine" filter (not shown) for matching with a spectrum shaping filter from the transmission end which is also represented by a "square root raised cosine" filter. The half-Nyquist filter 11 filters out undesirable signals including the out-of-band noise and signal interference injected by adjacent channels. A conventional implementation of the half-Nyquist filter 11 uses a FIR filter which operates at the rate of two samples per symbol, that is, 2/T where T denotes the symbol duration.

The demodulated signals produced by the half-Nyquist filter 11 should preferably be free of any carrier error. Before Q and I signals are fed into the half-Nyquist filter 11, the complex multiplier 12 is coupled in front of the half-Nyquist filter 11 for correcting any carrier errors. After the demodulated signals are generated from the half-Nyquist filter 11, a carrier discriminator 13 is coupled to the output of the half-Nyquist filter 1 1 to estimate the carrier error in the demodulated signals. The carrier discriminator 13 sends the estimated carrier error to a carrier loop filter 14 to control the oscillation of a carrier NCO 15, a numerically controlled oscillator. The carrier NCO 15 generates a complex sinusoid tone of the form: $\cos(\Delta\omega n+\Delta\theta)-j * \sin(\Delta\omega n+\Delta\theta)$, where the symbol $\Delta\omega$ denotes the carrier frequency error and the symbol $\Delta\theta$ denotes the carrier phase error. In computing a complex number in the form of $(I+jQ) * (\cos+j\sin)$, the complex multiplier 12 multiplies the I signal, which represents a real part of the complex number, and the Q signal, which represents an imaginary part of the complex number, by the complex sinusoid tone of $\cos(\Delta\omega n+\Delta\theta)-j * \sin(\Delta\omega n+\Delta\theta)$ to produce a product value that is free of carrier error. The complex multiplier 12, the carrier discriminator 13, the carrier loop filter 14, and the carrier NCO 15 combine to form a phase-lock loop for carrier synchronization.

Similar to the carrier synchronization, a symbol timing synchronization of a phase-lock loop is formed from the combination of the interpolator 9, a symbol timing discriminator 16, a symbol timing loop filter 17, and the symbol timing NCO 10. One difference between the carrier synchronization and the symbol timing synchronization is that the symbol timing NCO 10 does not generate oscillating complex tone but rather the symbol timing NCO 10 generates periodic timing phases, indicating the locations of the synchronous data samples in the sequence of an asynchronous input data.

A conventional FIR interpolator, such as the interpolator 9, is typically limited to an interpolation rate of at least a one-half ratio between the output rate verses the input rate. If the interpolator 9 is required to interpolate data at less than a one-half ratio, the out-of-band noise spectral component will be aliased into the desired spectral range, rendering the interpolator 9 unable to accurately interpolating the data. For example, if the input rate from ADC 6 to the interpolator 9 is at 60 mega samples per second, then the maximum output rate is typically limited to at least 30 mega samples per second. Thus, the demodulator 8 as shown in FIG. 2 cannot operate at a symbol rate of less than a one-quarter ratio of the sampling rate from ADC 6. A conventional solution to resolve the one-half sampling rate limitations of an interpolator is to couple a decimator (not shown) in front of an interpolator. The decimation rate of the decimator, with a base power of two, is chosen so that the range of the interpolation rate is between ½ to 1.

In FIG. 3a, there is shown a conventional schematic circuit of a single-input-single-output ("SISO") programmable down-sampler. A two-fold decimator 18 receives an I or Q signal at an input data rate denoted by a symbol R. The output of the two-fold decimator 18 is decimated by a factor of two and the output rate is computed at R/2. The two-fold decimator 18 is cascaded to a two-fold decimator 19 to decimate by a factor of four and generates an output rate at R/4. The two-fold decimator 19 is further cascaded to a two-fold decimator 20 to decimate by a factor of eight and generates an output rate at R/8. A selector 21 receives a select control signal that determines which inputs to activate, either no decimation, decimation by a factor of two, decimation by a factor of four, or decimation by a factor of eight, to generate an output I or Q signal. A dual SISO programmable down-sampler can be used to implement a two-inputs-two-outputs programmable down-sampler. FIG. 3b shows an equivalent representation of the two-fold decimator 18 that contains a low pass filter (LPF) 22 and a down-sampler by two 23. The LPF 22 can be implemented as a half-band filter, with the coefficients of the half-band filter in the sequence of {..., 0, h(−5), 0, h(−3), 0, h(−1), h(0), h(1), 0, h(3), 0, h(5), 0, ...}, where h(−n)=h(n) and h(2n)=0 for any non-zero integer n.

The conventional polyphase two-fold decimator operates at one-half of the input rate, denoted by R/2, but supports only single-input-single-output computation. In order to compute both the output signals of I and Q, two SISO polyphase decimators are required, which would require two sets of hardware including twice the number of multipliers and adders.

Accordingly, it is desirable to have a programmable down-sampler that re-samples data at a variable-rate below the one-half sampling rate. It is also desirable to have a programmable down-sampler that computes I and Q signals in more integrated and reduced dimensions.

SUMMARY OF THE INVENTION

The present invention discloses a programmable down-sampler, comprising (1) a first mux having a pair of first inputs for receiving a first input signal and a second input signal, a pair of second inputs, a control input, a pair of outputs for generating a decimated quadrature output signal and a decimated in-phase output signal; (2) a first two-fold decimator having a pair of outputs coupled to the pair of second inputs of the first mux and having a pair inputs; (3) a second mux having a pair of first inputs for receiving the first input signal and the second input signal, a pair of second inputs, a control input, a pair of outputs coupled to the pair of inputs of the first two-fold decimator; (4) a second two-fold decimator having a pair of outputs coupled to the pair of second inputs of the second mux and having a pair of inputs; wherein a first control signal is coupled to the control input of the first mux to activate the pair of first inputs of the first mux for routing the first input signal and the second input signal directly to the pair of outputs of the first mux if no decimation is desired, a second control signal being coupled to the control input of the second mux to activate the pair of first inputs of the second mux for receiving the first input signal and the second input signal and the first control signal activating the pair of second inputs of the first mux which coupled to the pair of outputs of the first two-fold decimator if a decimation by a factor of 2 is desired.

A core processor for computing a two-input-two-output two-fold decimation operates at the same rate as the decimation input rate R. The decimations of the in-phase I signal and the quadrature Q signal are computed in an interleaved sequence of {Q"(n), I"(n), Q"(n+1), I"(n+1), ...} to generate output Q" signal and output I" signal. The programmable down-sampler contains a plurality of two-fold decimators cascaded in series arranged in a reverse order. The decimation by a factor $2^n$ is achieved by routing the input data through the last decimator which coupled to the last mux for generating a down-sampler in-phase signal and a down-sampler quadrature signal. The configuration of the cascaded two-fold decimator provides advantages in that the last two-fold decimator requires a narrow passband, but other two-fold decimators requires only a wide passband.

In a first embodiment, the programmable down-sampler is coupled between a complex multiplier and an interpolator. In a second embodiment, the in-phase and quadrature signals are fed through a complex multiplier, an interpolator, then the programmable down-sampler. In the third embodiment, the in-phase and quadrature signals are fed through an interpolator, a complex multiplier, then the programmable down-sampler.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4a is a schematic diagram of a digital QPSK demodulator in accordance to a first embodiment of the present invention;

FIG. 4b is a diagram of the step of sampling data at a reduced sampling rate in accordance to the first embodiment;

FIG. 5a is a schematic diagram of a digital QPSK demodulator in accordance to a second embodiment of the present invention;

FIG. 5b is a diagram of the step of sampling data at a reduced sampling rate in accordance to the second embodiment;

FIG. 6a is a schematic diagram of a digital QPSK demodulator in accordance to a third embodiment of the present invention;

FIG. 6b is a diagram of the step of sampling data at a reduced sampling rate in accordance to the third embodiment;

FIGS. 9a–h are flowgraphs of a cascaded decimator for decimating by a factor of eight;

DETAILED DESCRIPTION OF THE PREFERRED EMBODIMENT

Figure 1:
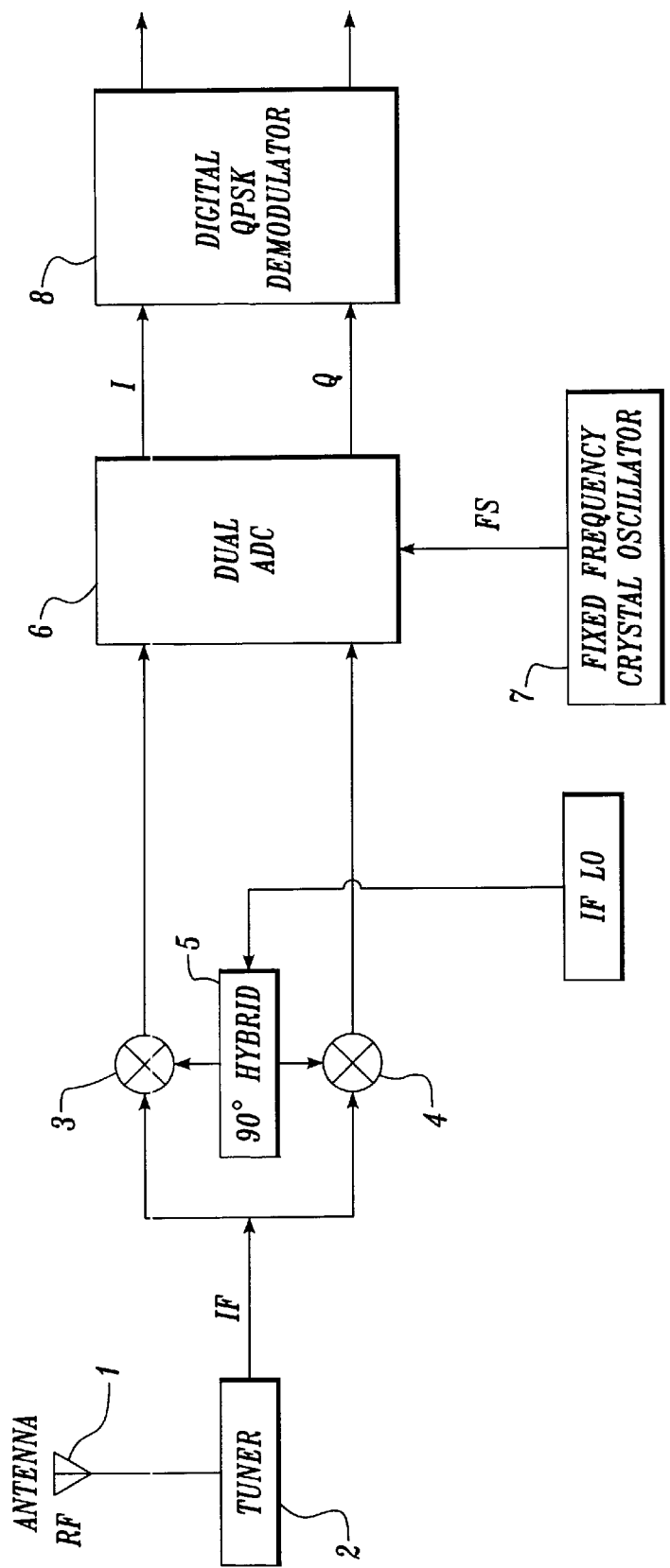
FIG. 1 is a prior art schematic diagram of a satellite QPSK receiver.
Figure 2:
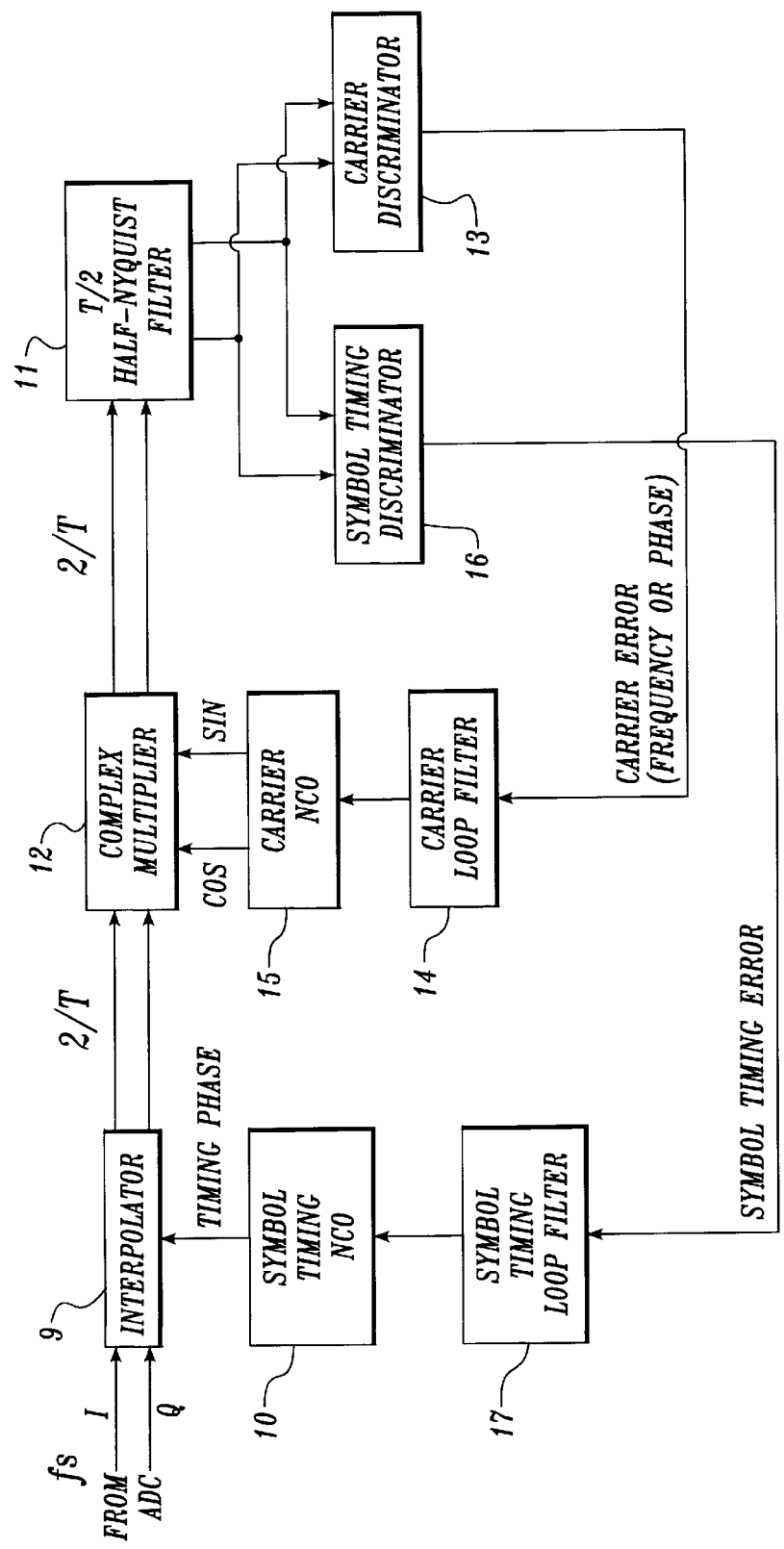
FIG. 2 is a prior art schematic diagram of a digital QPSK demodulator.
Figure 3A:
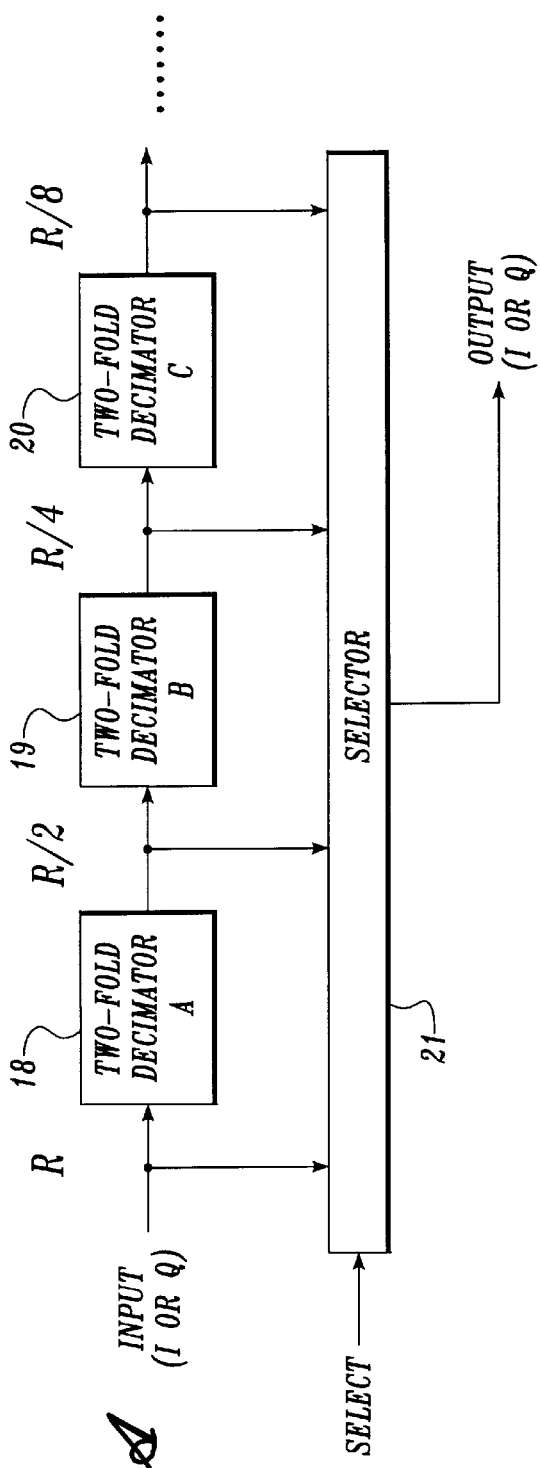
FIGS. 3a–3b are prior art schematic diagrams of a programmable down-sampler using single-input-single-output decimators.
Figure 3B:
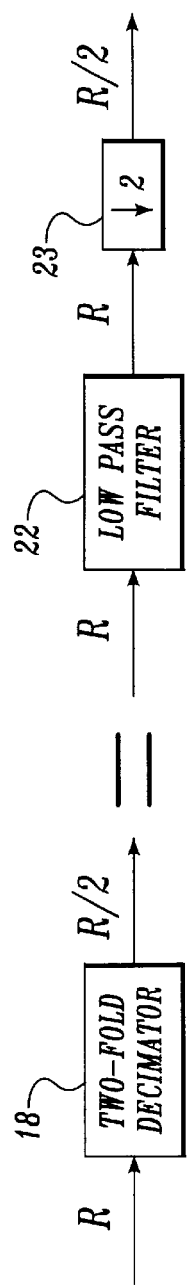

Referring now to FIGS. 4a and 4b, there is shown a schematic diagram of a digital QPSK demodulator in accordance with the first embodiment of the present invention. The digital QPSK demodulator 8 includes a programmable down-sampler 24 and conventional devices; which include the interpolator 9, the complex multiplier 12, the half-Nyquist filter 11, the carrier discriminator 13, the carrier loop filter 14, the carrier NCO 15, the symbol timing discriminator 16, the symbol timing loop filter 17, and a symbol timing NCO 10. In this embodiment, by coupling the complex multiplier 12 to the ADC converter 6, the complex multiplier 12 shifts the signal spectrum of the signals received from the ADC converter 6. The adjusted alignment of the signal spectrum by the complex multiplier 12 reduces the spectrum in which the signals may be filtered out by the down-sampler 24. The programmable down-sampler 24 receives data at a rate of fs, where the symbol fs represents the sampling rate of the ADC 6 in samples per second. The interpolator generates an output at a rate of 2/T, where 2/T denotes two samples per symbol. In FIG. 4b, there is shown a diagram of sampling data at a reduced sampling rate in accordance to the first embodiment. Assuming K=2, the complex multiplier 12 receives an in-phase signal and a quadrature signal at a rate of fs. The programmable down-sampler 24 receives the input at a rate of fs from the complex multiplier 12, and generates outputs at a rate of fs/4 to the interpolator 9. The interpolator 9 in turn generates outputs at a rate of 2/T. Suppose the value of fs was initially set at 60 MHz, the numerical value of fs/4 is 15 MHz and the numerical value of 2/T is between 7.5 MHz and 15 MHz.

In FIG. 5a, there is shown a schematic diagram of a digital QPSK demodulator in accordance to the second embodiment of the present invention. The digital QPSK demodulator 8 includes the programmable down-sampler 24 and conventional devices, which include the complex multiplier 12, interpolator 9, the half-Nyquist filter 11, the carrier discriminator 13, the carrier loop filter 14, the carrier NCO 15, the symbol timing discriminator 16, the symbol timing loop filter 17, and a symbol timing NCO 10. The interpolator 9 receives inputs from the complex multiplier 12 at a rate of fs, where the symbol fs represents the sampling rate of the ADC 6 in samples per second. The programmable down-sampler 24 receives inputs at a rate of $(2/T)*2^K$ from the interpolator 9 and generates outputs at a rate of 2/T, where 2/T represents two samples per symbol. In FIG. 5b, there is shown a diagram of sampling data at a reduced sampling rate in accordance to the second embodiment. Assuming K=2 and fs=60 MHz, the interpolator 9 receives the in-phase and quadrature signals at a rate of 60 MHz. The programmable down-sampler 24 receives inputs at a rate of $(2/T)*4$ MHz and generates outputs at a rate of 2/T, where 7.5 Mhz$\leq$2/T$\leq$15 MHz.

FIG. 6a is a schematic diagram of a digital QPSK demodulator in accordance to the third embodiment of the present invention. The digital QPSK demodulator 8 includes the programmable down-sampler 24 and conventional devices, which include the interpolator 9, the complex multiplier 12, the half-Nyquist filter 11, the carrier discriminator 13, the carrier loop filter 14, the carrier NCO 15, the symbol timing discriminator 16, the symbol timing loop filter 17, and a symbol timing NCO 10. This embodiment also provides the advantages of coupling the complex multiplier 12, instead of the interpolator 9, to the ADC converter 6, as described above with respect to the second embodiment. The complex multiplier 12 receives inputs at a rate of $(2/T) * 2^K$. The programmable down-sampler 24 receives inputs at a rate of $(2/T)*2^K$ and generates outputs at 2/T. In FIG. 6b, there is shown a diagram of sampling data at a reduced sampling rate in accordance to the third embodiment. Assuming K=2 and fs=60 MHz, the programmable down-sampler 24 receives inputs at a rate of $(2/T)*4$ and generates outputs at a rate of 2/T, where 7.5 Mhz$\leq$2/T$\leq$15 MHz.

Figure 7:
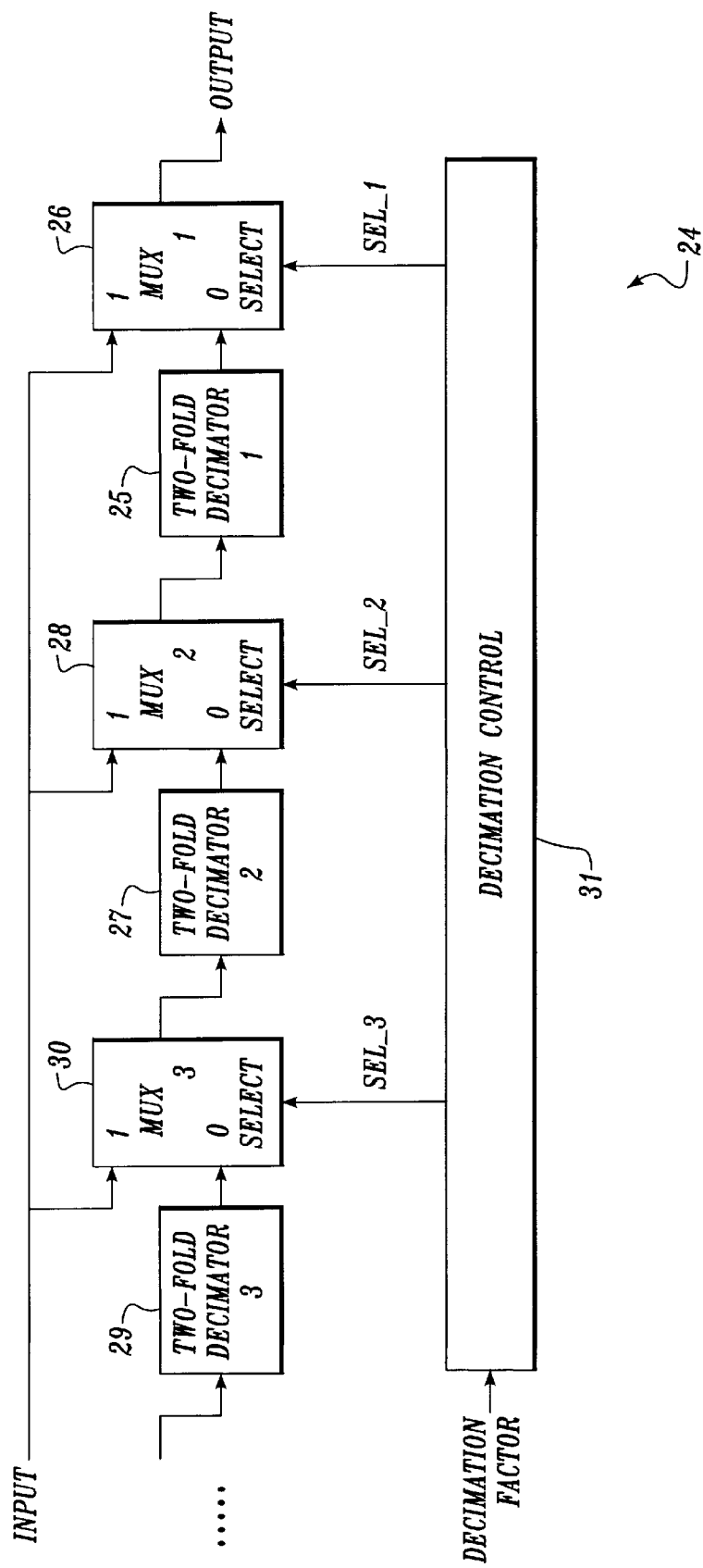
FIG. 7 is a schematic diagram of a (SISO) single-input-single-output programmable down-sampler.

In FIG. 7, there is shown a schematic diagram of the programmable single-input-single-output down-sampler. The hardware structure of the multiple stages of the decimators are connected in a reverse order. Each decimation stage includes a two-fold decimator that is coupled to a mux. A two-fold decimator 25 and a mux 26 form the last decimation stage for generating a down-sampler in-phase output signal or a down-sampler quadrature signal. The next to the last decimation stage is formed by the coupling of a two-fold decimator 27 and a mux 28. The second to the last decimation stage is formed by a two-fold decimator 29 coupled to a mux 30. Additional decimation stages, where each decimation stage contains a decimator and a mux, may be coupled to the two-fold decimator 29 if needed. The output of the mux 26 generates an output signal which represents the output signal of the programmable down-sampler 24.

If the input signal is intended to bypass the programmable decimator 24, then a decimation controller 31 sets a SEL__1 signal to a logic "1" state in the mux 26. If the input signal is intended to be decimated by a factor of two, then the decimation controller 31 sets a SEL__2 signals to a logic "1" state in the mux 28 and the SEL__1 signal is set to a logic "0" state in the mux 26. If a decimation by a factor of four is desired, then the SEL__3 signal is set to a logic "1" state in the mux 30, the SEL__2 state is set to a logic "0" state in the mux 28, and the SEL__1 is set to a logic "0" state in the mux 26. If a decimation by a factor of eight is desired, the SEL__4 signals is set to a logic "1" state, while the SEL__3, SEL__2, and SEL__1 signals are all set to a logic "0" state. The first inputs of the muxes 26, 28, and 30 for each respective decimation stage are commonly coupled to receive the input signal of the programmable down-sampler 24 by setting the SEL__3, SEL__2, and SEL__1 to a logic "1" state. The second input of the mux 26 receives signals from the two-fold decimator 25 when the SEL__1 is set to a logic "0" state. The second input of the mux 28 receives signals from the two-fold decimator 27 when the SEL__2 is set to a logic "0" state. The second input of the mux 30 receives signals from the two-fold decimator 29 when the SEL__3 is set to a logic "0" state. This method of setting selected signals applies equally to a decimation at an order higher than eight. Table 1 summarizes the operations and the logic states of the signals described above.

TABLE 1

| Input Data Rate | Order of Decimator | Number of Decimator Used | Output Data Rate | SEL__ 4 | SEL__ 3 | SEL__ 2 | SEL__ 1 |
|---|---|---|---|---|---|---|---|
| R | 1 | 0 | R | X | X | X | 1 |
| R | 2 | 1 | R/2 | X | X | 1 | 0 |
| R | 4 | 2 | R/4 | X | 1 | 0 | 0 |
| R | 8 | 3 | R/8 | 1 | 0 | 0 | 0 | where the symbol X denotes a don't care state

Figure 8:
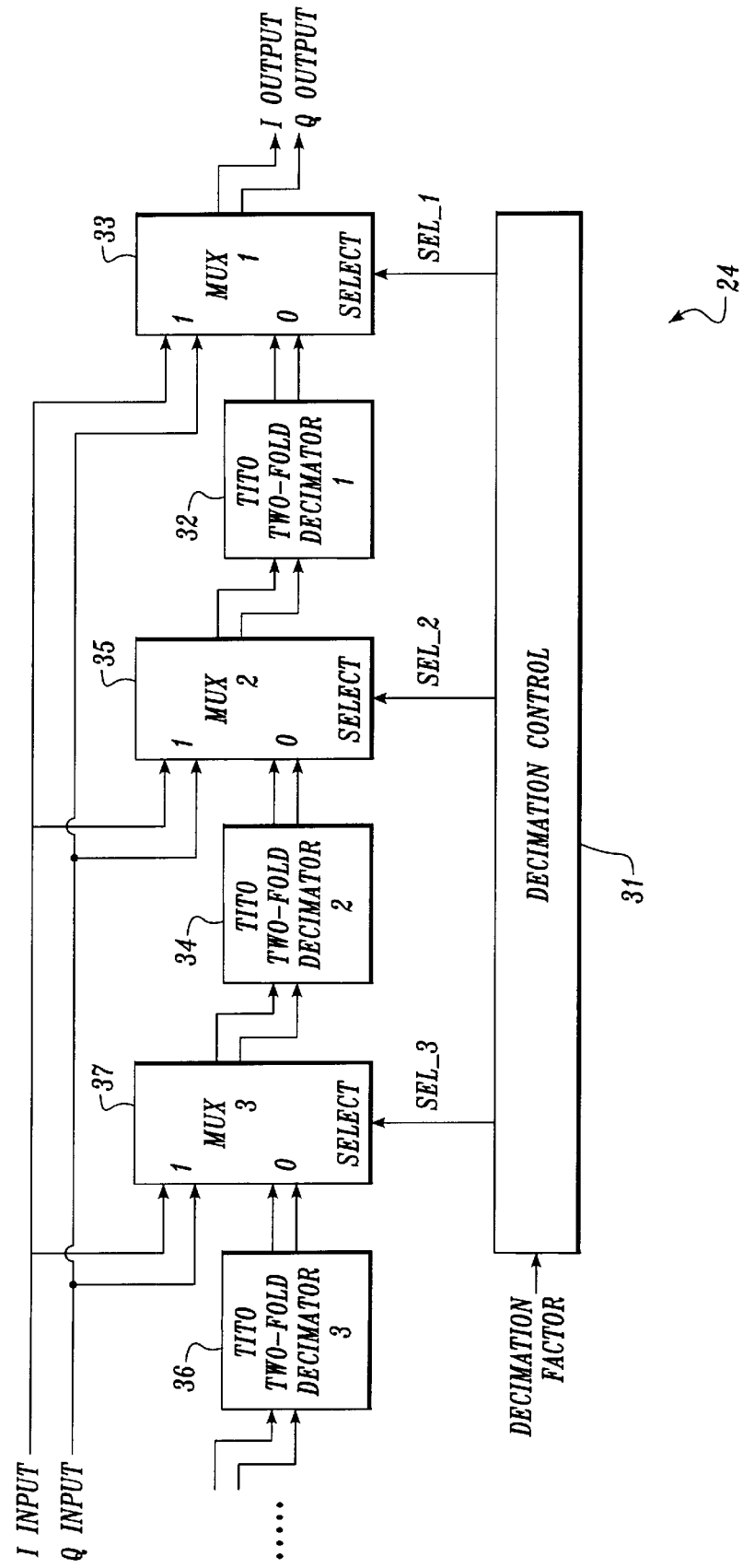
FIG. 8 is a schematic diagram of a two-inputs-two-outputs (TITO) programmable down-sampler.

FIG. 8 shows a schematic diagram of a programmable two-inputs-two-outputs (TITO) down-sampler 24. The hardware structure of the multiple stages of the TITO decimators are also connected in the reverse order. Each TITO decimation stage includes a TITO two-fold decimator that is coupled to a mux. A TITO two-fold decimator 32 and a mux 33 form the last TITO decimation stage that generates a pair of outputs for generating a down-sampler in-phase output signal and a down-sampler quadrature signal. The next to the last TITO decimation stage is formed by coupling a two-fold decimator 34 to a mux 35. The second to the last TITO decimation stage is formed by a TITO two-fold decimator 36 coupled to a mux 37. Additional TITO decimation stages, where each decimation stage contains a decimator and a mux, may be coupled to the TITO two-fold decimator 36 if needed. The output of the mux 33 generates the output signals which represent the output signals of the programmable down-sampler 24.

If the pair of input signals are intended to bypass the programmable down-sampler 24, then a decimation controller 31 sets a SEL_1 signal to a logic "1" state in the mux 33. If the pair of input signals are intended to be decimated by a factor of two, then the decimation controller 31 sets a SEL_2 signals to a logic "1" state in the mux 35 and the SEL_1 signal is set to a logic "0" state in the mux 33. If a decimation by a factor of four is desired, the SEL_3 signal is set to a logic "1" state in a mux 37, the SEL_2 signal is set to a logic "0" state in the mux 35, and the SEL_1 is set to a logic "0" state in the mux 33. This method of setting selected signals applies equally to a decimation at an order higher than four. The first pair of inputs of the muxes 33, 35, and 37 for each respective decimation stage are commonly coupled to receive the input signal of the programmable down-sampler 24 by setting the SEL_3, SEL_2, and SEL_1 to a logic "1" state. The pair of second inputs of the mux 33 receives signals from the TITO two-fold decimator 32 when the SEL_1 is set to a logic "0" state. The pair of second inputs of the mux 35 receives signals from the TITO two-fold decimator 34 when the SEL_2 is set to a logic "0" state. The pair of second inputs of the mux 37 receives signals from the TITO two-fold decimator 36 when the SEL_3 is set to a logic "0" state. This method of setting selected signals applies equally to a decimation at an order higher than eight. Table 1 summarizes the operations and the logic states of the signals described above.

The chart in Table 1 is applicable to the TITO two-fold decimators of the down-sampler 24 as well. The TITO two-fold decimators 32, 34, and 36 operate at the same rate as its own input data rate R, which doubles the speed of a conventional polyphase decimator that operates at a rate of R/2. The in-phase I signal and the quadrature Q signal are computed in an interleaved sequence of $\{Q"(n), I"(n), Q"(n+1), I"(n+1), \ldots\}$ to generate Q" output and I" output, thereby reducing the amount of computational components, such as the multipliers and the adders, to one-half.

In FIGS. 9a–h, there are shown flowgraphs of three cascaded two-fold decimators decimated by a factor of eight, as shown in block diagrams in FIGS. 7 and 8. The two-fold decimator 25 by itself decimates a signal by a factor of two. The cascading of two-fold decimators 25 and 27 decimates a signal by a factor of four. The cascading of two-fold decimators 25, 27, and 29 decimates a signal by a factor of eight. Low pass filters ("LPF") 38, 40, and 42 preceding each of the ↓ decimators 39, 41, and 43 ensure that the signal being decimated is bandlimited. Similarly, the cascading the low pass filters and the ↓ decimators applies equally to two-fold decimators 32, 34, and 36. In FIG. 9a, the "w" signal enters the two-fold decimator 29 at a rate of 8R, passes through a low-pass filter 38 and a down-sampler by two 39, and generates a signal x. The signal x feeds to the two-fold decimator 27 at a rate of 4R, passes through a low-pass filter 40 and a down-sampler by two 41, and generates an output signal y. The output signal y feeds to the two-fold decimator 25 at a rate of 2R, passes through a low-pass filter 42 and a down-sampler 43, and generates an output signal z. FIG. 9b shows the signal spectrum of an input signal w entering the decimator 29 that is being sampled at a rate 8R. FIG. 9c depicts the frequency response of the decimation LPF_3 and shows the locations of the passband, transition, and stopband. The frequency response of the decimation LPF_3 has a narrow passband but the passband is sufficiently wide to permit transmission of the desired signal. The narrow passband in decimation LPF_3 produces a smooth transition. The stopband filters out the unwanted noise spectral component embodied in the signal w near the frequency 4R and thus preventing the noise from being aliased into the output signal x. FIG. 9d shows the spectrum of the signal x where the data rate is taken at a rate of 4R and the signal is re-sampled at a rate of 4R. In FIG. 9e, there is shown a frequency response of the decimation LPF_2. Similar to the LPF_3, the LPF_2 has a narrow passband and a smooth transition. The stopband of LPF_2 prevents the noise from aliasing around frequency 2R. FIG. 9f shows the output signal y of the two-fold decimator 27 where the data is taken at a rate of 2R and the desired signal is also re-sampled at a rate of 2R. In FIG. 9g, there is shown a frequency response of the decimation LPF_1. The LPF_1 must possess the characteristics of having a wide passband and thus a sharp transition. The stopband of LPF_1 prevents the aliasing of the noise around the frequency R. FIG. 9h shows the output signal z of the decimator 25 where the data is taken a rate of R and the desired signal is also re-sampled at a rate of R.

In a cascaded decimator, the low pass filters for all but the last decimator process the characteristics of having narrow passband widths. The narrow passband widths produce smooth cut-off transition and require shorter filter lengths. The last decimator has a sharp cut-off transition and requires a longer filter length. If the pass band width of the last low pass filter, namely the LPF 1, is denoted by $\Omega\_pass\_1$, then the passband width of the last n-th LPF, namely LPF n, is denoted by $\Omega\_pass\_n$. The representation of $\Omega\_pass\_n$ equals to $\Omega\_pass\_ \frac{1}{2}^{n-1}$. For example, if LPF1 requires the filter length of $\Omega\_pass\_1=2\pi/4$ radians per sample then $\Omega\_pass\_2=2\lambda/8$ and $\Omega\_pass\_3=2\pi/16$. The $\Omega\_pass\_1$ filter requires longer filter length which increases the costs of the components. The $\Omega\_pass\_2$ and $\Omega\_pass\_3$ filters require shorter filter lengths which reduce the cost of the components, and thus the costs of the overall design.

Figure 10:
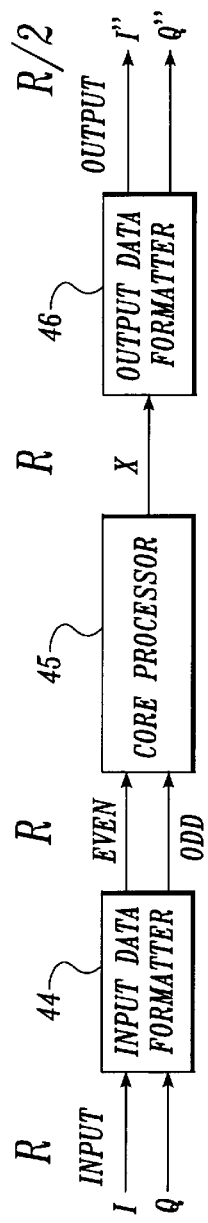
FIG. 10 is a schematic diagram of a TITO two-fold decimator in accordance to the present invention.

Referring now to FIG. 10, there is shown the schematic diagram of the TITO two-fold decimator residing in the programmable down-sampler 32, 34, or 36 including an input data formatter 44, a core processor 45, and an output data formatter 46. The input data formatter 44 receives at the inputs the in-phase I and quadrature Q signals. The input data formatter 44 generates a stream of even-time data containing I and Q signals and a stream of odd-time data containing I and Q signals. The core processor 45 computes the even-time data and the odd-time data in an interleaved sequence to generate an output X. The output data formatter 46 de-muxes the X data to produce an output I signal and an output Q signal. For example, suppose the I input terminal of the input data formatter 44 receives the following data:

I(2n), I(2n+1) I(2n+2), I(2n+3) I(2n+4), I(2n+5) I(2n+6), I(2n+7), etc., and the Q input terminal of the input data formatter 44 receives the following data: Q(2n), Q(2n+1) Q(2n+2), Q(2n+3) Q(2n+4), Q(2n+5) Q(2n+6), Q(2n+7), etc., the input data formatter 44 generates a stream of even-time data: Q(2n) I(2n), Q(2n+2) I(2n+2), Q(2n+4) I(2n+4), Q(2n+6) I(2n+6), etc. as well as generating a stream of odd-time data: Q(2n−1) I(2n−1), Q(2n+1) I(2n+1), Q(2n+3) I(2n+3), Q(2n+5) I(2n+5), etc. In response to the even-time and odd-time data transmitted from the input data formatter 44, the core processor 45 subsequently produces X data, for example, as follows: Q"(n−3) I"(n−3), Q"(n−2) I"(n−2), Q"(n−1) I"(n−1), and Q"(n) I"(n). The output data formatter 46 generates an output I": I"(n−3), I"(n−2), I"(n−1), I"(n), and output Q": Q"(n−3), Q"(n−2), Q"(n−1), Q"(n), where:

$$I"(n)=h(O) * I(2n)+\Sigma h(k) * \{I(2n-k)+I(2n+k)\} k=1, 3, 5, 7 \ldots$$

$$Q"(n)=h(O) * Q(2n)+\Sigma h(k) * \{Q(2n-k)+Q(2n+k)\} k=1, 3, 5, 7 \ldots$$

A first output I" signal is generated correspondingly to a first input I signal. A second output Q" is generated correspondingly to a second input Q signal. The positioning of the first and second inputs can be swapped such that the Q signal represents the first signal and the I signal represents the second signal. The composite of I and Q can be viewed on a discrete timing index, with the timing spectrum denoted by t. The indexing of the even-time data and odd-time data is labeled on the basis of when a timing snapshot is selected. If the snapshot of the data on time t occurs on $\{\ldots, t-2, t, t+2, \ldots\}$ and designated as the odd-time data, then the data at $\{\ldots, t-1, t+1, t+3, \ldots\}$ is designated as the even-time data.

Figure 11:
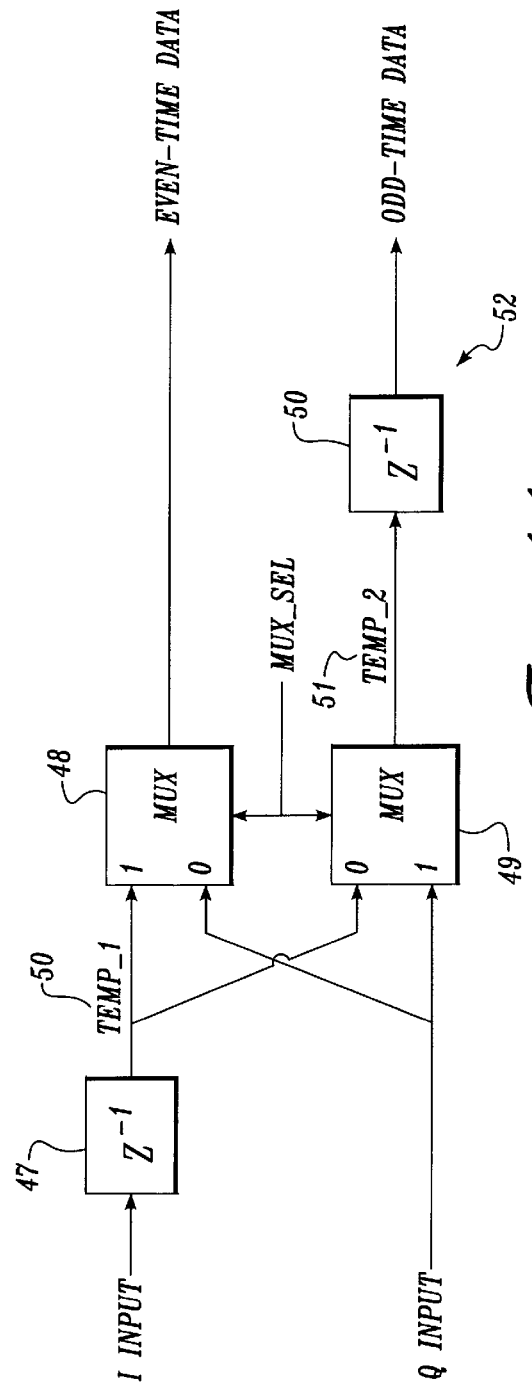
FIG. 11 is a schematic diagram of an input data formatter residing in a two-fold decimator.

In FIG. 11, the input data formatter 44 includes a $Z^{-1}$ register 47, a mux 48, a mux 49, and a $Z^{-1}$ register 50. The input data formatter 44 generates a stream of even-time data containing I and Q signals and a stream of odd-time data containing I and Q signals to the core processor 45. The $Z^{-1}$ register 47 receives a stream of I signals in the sequence of: I(2n), I(2n+1), I(2n+2), I(2n+3), I(2n+4), I(2n+5), I(2n+6), I(2n+7), etc. The $Z^{-1}$ register 47 generates a Temp_1 50 in the data sequence of: I(2n−1), I(2n), I(2n+1), I(2n+2), I(2n+3), I(2n+4), I(2n+5), I(2n+6), etc. The Q signal includes a sequence of Q(2n), Q(2n+1), Q(2n+2), Q(2n+3), Q(2n+4), Q(2n+5), Q(2n+6), Q(2n+7), etc., and is received by a mux 48, or mux 49 depending on a control signal MUX_SEL. The muxes 48 and 49 have two inputs, a logic "0" or logic low state, and a logic "1" or logic high state and are enabled by the control signal MUX_SEL. The mux 48 generates an output of an even-time data from the Q signal when the MUX_SEL signal enabled the logic low state of the mux 48 and generates an output of an even-time data from the I signal when the MUX_SEL enabled the logic high state of the mux 48. The mux 49 generates an output of an odd-time data from the I signal when the MUX_SEL signal enabled the logic low state in the mux 49 and generates an output of an odd-time data from the Q signal when the MUX_SEL enabled the logic high state in the mux 49. The mux 49 generates a Temp_2 51 in the data sequence of: I(2n−1), Q(2n+1), I(2n+1), Q(2n+3), I(2n+3), Q(2n+5), I(2n+5), Q(2n+7), etc. The mux 48 generates a stream of even-time data: Q(2n), I(2n), Q(2n+2), I(2n+2), Q(2n+4), I(2n+4), etc. The $Z^{-1}$ register 50 generates a stream of odd-time data: Q(2n−1), I(2n−1), Q(2n+1), I(2n+1), Q(2n+3), I(2n+3), Q(2n+5), I(2n+5), etc.

Figure 12A:
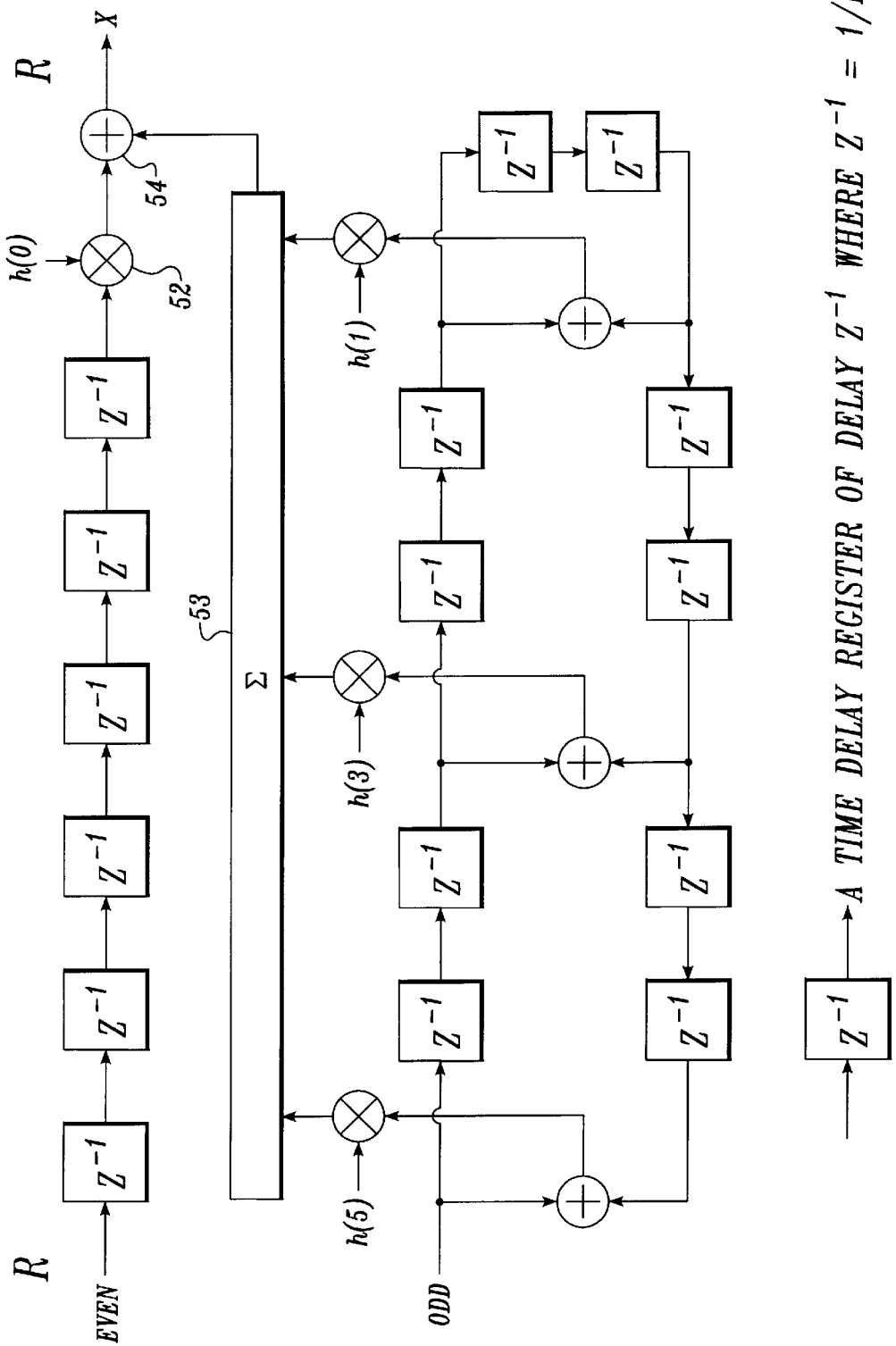
FIG. 12a is a schematic diagram of the core processor as shown in FIG. 10 with time delay registers denoted by $Z^{-1}$.

Referring now to FIG. 12*a*, there is shown a schematic circuit of a core processor that computes I" and Q" outputs.

The symbol X denotes the outputs of I" and Q" processed in an interleaving sequence through a summation to two branches. The upper even-phase filter receives the even-time data from the input data formatter 44 and implements the coefficients of an even-phase filter in the sequence of {0, 0, 0, 0, 0, h(0), 0, 0, 0, 0, 0}. The upper even-phase filter has only one non-zero coefficient, which can be computed by a series of delays denoted by a symbol $Z^{-1}$ and a multiplication by that none-zero coefficient. The symbol $Z^{-1}$ is equal to 1/R, where R denotes the input rate of a two-fold decimator. The lower odd-phase filter receives, for example, the odd-time data from the input data formatter 44 and implements the coefficients of an odd-time filter in the sequence of {h(5), 0, h(3), 0, h(1), 0, h(1), 0, h(3), 0, h(5)}. The sequence of the coefficients of the odd-time filter can be extended, for example, to $\{\ldots, h(7), 0, h(5), 0, h(3), \ldots, h(3), 0, h(5), 0, h(7), \ldots\}$. The lower odd-phase filter contains symmetric coefficients, so that the filter can be computed by summing each pair of data in the symmetric positions corresponding to the same coefficient, multiplying the corresponding coefficient, and summing all of the products to produce the filter output. The output of a multiplication 52 by h(o) represents the output of the first filter. The output of a summation 53 represents the output of the second filter. The output of the multiplication 52 and the output of the summation 53 are summed by a summer 54 to generate the output X.

Figure 12B:
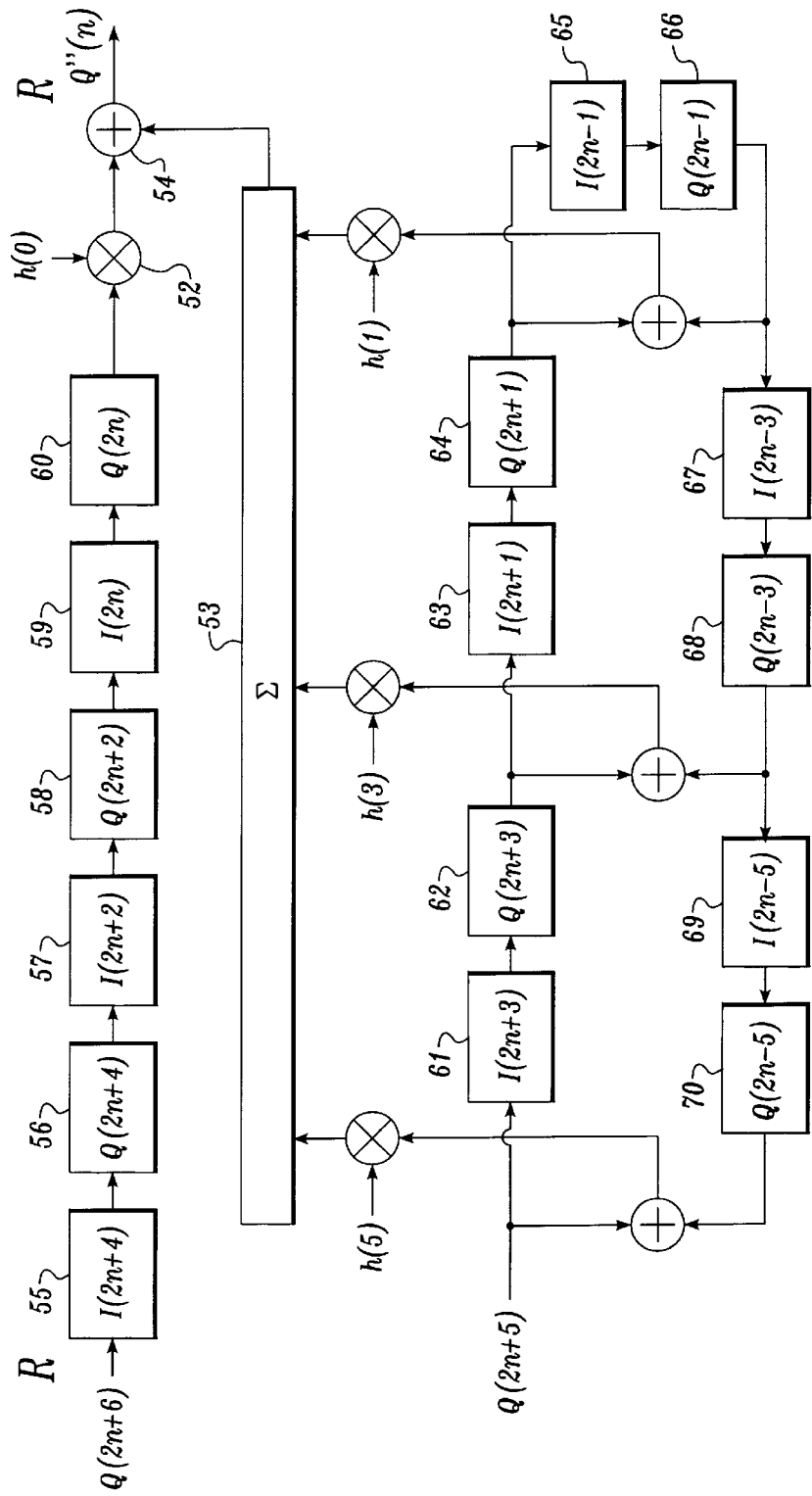
FIG. 12b illustrates the operation of the core processor with respect to FIG. 12a that computes the quadrature decimation output Q" at t present time.

FIGS. 12*b* is the core processor in the TITO two-fold decimator computing the output Q at a present time in accordance to FIG. 12*a*. The numerical values of I and Q as shown in FIG. 12*b* illustrates an example of a snapshot frozen at the present time. At the present time, the input of the upper branch, or even-time data, is Q(2n+6). The numerical values of the contents of a plurality of shift registers 55, 56, 57, 58, 59, and 60 in the upper-branch contain the following data: I(2n+4), Q(2n+4), I(2n+2), Q(2n+2), I(2n), and Q(2n). In the present time, the input of the lower branch, or odd-time data, contains Q(2n+5). The numerical values of the contents of a plurality of shift registers 61, 62, 63, 64, 65, 66, 67, 68, 69, 70 in the lower-branch contain the follow data: I(2n+3), Q(2n+3), I(2n+1), Q(2n+1), I(2n−1), Q(2n−1), I(2n−3), Q(2n−3), I(2n−5), and Q(2n−5). The output of a two-fold decimator is denoted by the symbol Q"(n).

Figure 12C:
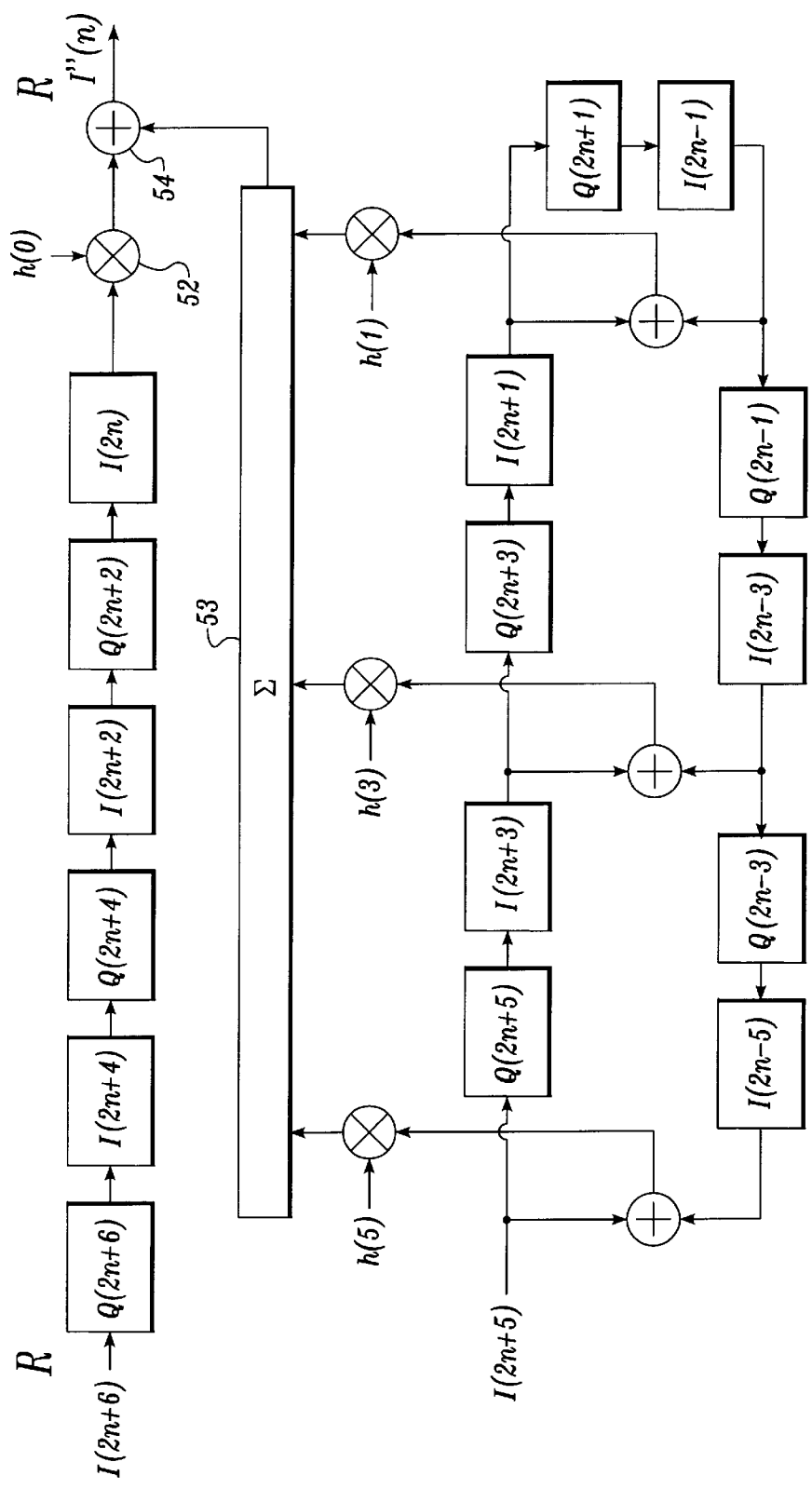
FIG. 12c illustrates the operation of core processor that computes the in-phase decimation output I" at time t+1.

FIG. 12*c* is the core processor in the TITO two-fold decimator computing the output I at the next time unit relative to a t+1 time in accordance to FIG. 12*b*. The numerical values of I and Q as shown in FIG. 12*c* illustrates an example of a snapshot frozen at t+1 time, where t represents the present time as described with respect to FIG. 12*b*. At t+1 time, the input of the upper branch, or even-time data, holds I(2n+6) data. At t+1 time, the input of the lower branch, or odd-time data, holds I(2n+5) data. The output of the TITO decimator is denoted by symbol I"(n).

Figure 13:
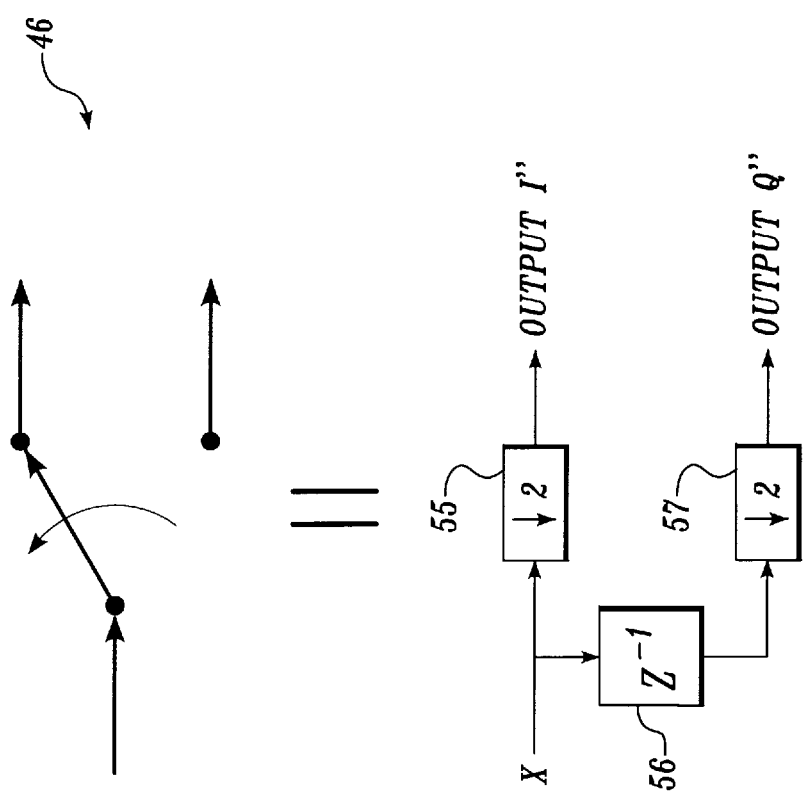
FIG. 13 is a schematic diagram of an output data formatter residing in the two-fold the decimator.

In FIG. 13, there is shown an output data formatter 46 for generating output decimated data at the ratio of one-half the input rate. The output data formatter 46 effectively operates to de-mux the I and Q signals. The output data formatter 46, functioning similar to a switching device, receives a signal input X and transferring the data to one of the two possible outputs. The X data propagates through a decimator 55 that decimates the X data by two. The decimator 55 generates an output signal I". Alternatively, the X data propagates through a $Z^{-1}$ register 56 and a decimator 57, and thus generating an output Q". As an illustration, if the X data contains Q"(n−3) I"(n−3), Q"(n−2) I"(n−2), Q"(n−1) I"(n−1), Q"(n) and I"(n), then correspondingly the decimator 55 generates output I" in the sequence of I"(n−3), I"(n−2), I"(n−1), and I"(n) while the decimator 57 generates output Q" in the sequence of Q"(n−3), Q"(n−2), Q"(n−1), Q"(n).

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A system including a single-input-single-output (SISO) programmable down-sampler, comprising:
   a first mux having a first input for receiving an input signal, a second input, a control input, and an output for generating an output signal;
   a first two-fold decimator having an input and having an output coupled to the second input of the first mux, the first two-fold decimator having a wide passband decimation filter;
   a second mux having a first input for receiving the input signal, a second input, a control input, and an output coupled to the input of the first two-fold decimator; and
   a second two-fold decimator having an input and an output coupled to the second input of the second mux, the second two-fold decimator having a narrow passband decimation filter;
   wherein a first control signal is coupled to the control input of the first mux to activate the first input of the first mux for routing the input signal directly from the first input of the first mux to the output of the first mux if no decimation is desired, a second control signal is coupled to the control input of the second mux to activate the first input of the second mux for receiving the input signal through the first two-fold decimator and the first control signal activating the second input of the first mux which is coupled to the output of the first two-fold decimator if decimation by a factor of two is desired.

2. The system of claim 1 wherein the SISO programmable down-sampler, further comprising:
   a n mux having a first input for receiving the input signal, a second input, a control input, and an output coupled to the input of a n−1 two-fold decimator; and
   a n-two-fold decimator having an input for receiving the input signal and an output coupled to the second input of the n mux, the n two-fold decimator having a narrow passband decimating filter;
   wherein a n control signal is coupled to the control input of the n mux to activate the first input of the n mux for receiving the input signal, the (n−1), . . . , second, first control signals activating the second inputs of the (n−1), . . . , second, first mux for switching the output of the (n−1), . . . , second, first two-fold decimators if decimation by a factor of $2^{n-1}$ is desired.

3. The system of claim 2, wherein the input signal contains a mixture of a stream of even-time data and a stream of odd-time data.

4. The system of claim 3, wherein each of the first, second, and n two-fold decimators comprising:
   a switching demux for separating the odd-time data from the even-time data;
   a multiplier for multiplying the even-time data with a non-zero coefficient to generate a stream of scaled even-time data;
   a summer for generating a stream of filtered odd-time data by summing the products of the odd-time data multiplied by symmetric coefficients; and
   a summer for summing the stream of the scaled even-time data with the stream of the filtered odd-time data.

5. A method for computing a down-sampler having a plurality of decimators cascaded in series, comprising the steps of:
   receiving an input data;
   routing the input data to an output terminal thereby bypassing the plurality of decimators, if no decimation is desired;
   decimating by a factor of two by routing the input data through a last decimator in the plurality of decimators, the last decimator having a wide passband decimation filter; and
   decimating by a factor of four by routing the input data through a next to the last decimator in the plurality of decimators, the next to the last decimator having a narrow passband decimation filter.

6. The method of claim 5 further comprising the step of decimating by a factor of $2^n$ by routing the input data through n decimators in the plurality of decimators, the data passing through the last decimator being filtered by a wide passband, the data passing through the plurality of decimators other than the last decimator being filtered by the narrow passband.

7. The method of claim 6 wherein prior to the decimating steps, the input data contains a mixture of a stream of even-time data and a stream of odd-time data.

8. The method claim 7 further comprising the steps of:
   multiplying the even-time data by a non-zero coefficient to generate a stream of a first filter output;
   summing the products of the odd-time data multiplied by symmetric coefficients to generate a stream of second filter output; and
   summing the stream of the first filter output with the stream of the second filter output to generate a stream of output data.

9. A demodulator including a two-inputs-two-outputs (TITO) programmable down-sampler, comprising:
   a first mux having a pair of first inputs for receiving a first input signal and a second input signal, a pair of second inputs, a control input, a pair of outputs for generating a decimated quadrature output signal and a decimated in-phase output signal;
   a first two-fold decimator having a pair of outputs coupled to the pair of second inputs of the first mux and having a pair of inputs;
   a second mux having a pair of first inputs for receiving the first input signal and the second input signal, a pair of second inputs, a control input, a pair of outputs coupled to the pair of inputs of the first two-fold decimator;
   a second two-fold decimator having a pair of outputs coupled to the pair of second inputs of the second mux and having a pair of inputs;
   wherein a first control signal is coupled to the control input of the first mux to activate the pair of first inputs of the first mux for routing the first input signal and the second input signal directly to the pair of outputs of the first mux if no decimation is desired, a second control signal being coupled to the control input of the second mux to activate the pair of first inputs of the second mux for receiving the first input signal and the second input signal and the first control signal activating the pair of second inputs of the first mux which are coupled to the pair of outputs of the first two-fold decimator if a decimation by a factor of 2 is desired.

10. The demodulator of claim 9 further comprising:

a n mux having a pair of first inputs for receiving the first input signal and the second input signal, a pair of second inputs, a control input, and a pair of outputs; and a n-two-fold decimator having a pair of inputs for receiving the first input signal and the second input signal, and a pair of outputs coupled to the second inputs of the n mux;

wherein a n control signal is coupled to the control input of the n mux to activate the first inputs of the n mux for receiving the first input signal and the second input signal, the first, second, . . . , n−1 control signals activating the respective one of the pair of second inputs of the first, second, . . . , n−1 muxes switched to the outputs of the first, second, . . . , n−1 two-fold decimators if a decimation by a factor of $2^{n-1}$ is desired.

11. The demodulator of claim 10 wherein the first and second input signals include a quadrature input signal and an in-phase input signal.

12. The demodulator of claim 11 wherein each of the first two-fold decimator and n-two-fold decimator comprising an input data formatter, the input data formatter comprising:

a first register having an input for receiving the first input signal;

a first mux having a first input coupled to the output of the first register, a second input for receiving the second input signal, and an output for generating an even-time data;

a second mux having a first input for receiving the second input signal and a second input coupled to the output of the first register, and an output; and a second register having an input coupled to the output of the second mux and an output for generating an odd-time data.

13. The demodulator of claim 12 wherein each of the first and n two-fold decimator comprising:

a multiplier for multiplying a plurality of signals that interleaves a plurality of even-time formatted data containing the first and second input signals to generate a stream of scaled even-time data;

a summer for summing the products of a plurality of odd-time formatted data containing the first and second input signals multiplied by symmetric coefficients to generate a stream of filtered odd-time data; and a summer for summing the stream of the scaled even-time data and the stream of the filtered odd-time data to generate a stream of interleaved data that interleaves the decimated first and second input signals.

14. The demodulator of claim 13 further comprising an output data formatter, including:

a register having an input for receiving the stream of interleaved data;

a first decimator having an input for receiving the stream of interleaved data and generating a decimated in-phase output; and a second decimator having an input coupled to the output of the register and generating a decimated quadrature output signal.

15. The system of claim 14 further comprising a complex multiplier having inputs for receiving the quadrature signal and the in-phase signal and output coupled to inputs of the TITO down-sampler.

16. The system of claim 15 further comprising an interpolator coupled to outputs of the TITO down-sampler.

17. The system of claim 14 further comprising an interpolator having inputs and outputs coupled to inputs of the TITO down-sampler.

18. The system of claim 17 further comprising a complex multiplier having inputs for receiving the quadrature input signal and the in-phase input signal and outputs coupled to the inputs of the interpolator.

19. The system of claim 14 further comprising a complex multiplier having inputs and outputs coupled to inputs of the TITO programmable down-sampler.

20. The system of claim 19 further comprising an interpolator having inputs for receiving the quadrature input signal and the in-phase input signal and outputs coupled to the inputs of the complex multiplier.

21. A method for generating a variable-rate TITO decimation, comprising the steps of:

receiving a pair of input signals containing a quadrature signal and an in-phase signal;

bypassing a decimation circuit including a plurality of decimators if no decimation is desired;

decimating by a factor of two by routing the quadrature signal and the in-phase signal through a last decimator that has a wide passband decimation filter; and decimating by a factor of four by routing the quadrature signal and the in-phase signal through a next to the last decimator that has a narrow passband decimation filter.

22. The method of claim 21 further comprising the step of decimating by a factor of $2^n$ by routing the data through the last n decimators in the plurality of decimators, the pair of input signals passing through the last decimator being filtered by a wide passband decimation filter, the pair of input signals passing through the plurality of decimators other than the last decimator being filtered by narrow passband decimation filters.

23. The method according to claim 22 wherein prior to receiving the pair of input signals, generating a stream of even-time data containing the quadrature and in-phase input signals; and generating a stream of odd-time data containing the quadrature and in-phase input signals.

24. The method according to claim 23 wherein at each decimating step, the method comprising the steps of:

multiplying the even-time data by a non-zero coefficient to generate a stream of a first filter output;

generating a stream of second filter output by summing products of the odd-time data multiplied by symmetric coefficients; and summing the stream of the first filter output with the stream of the second filter output to generate a stream of output signals that interleaves the decimated quadrature data and the decimated in-phase signals.

25. The method according to claim 24 further comprising the steps of:

generating a decimated quadrature output signal by extracting the decimated quadrature signal from the stream of the interleaved data; and generating a decimated in-phase output signal by extracting the decimated in-phase signal from the stream of interleaved data.

* * * * *